(12) United States Patent
Hiatt et al.

(10) Patent No.: US 9,337,162 B2
(45) Date of Patent: *May 10, 2016

(54) MULTI-COMPONENT INTEGRATED CIRCUIT CONTACTS

(75) Inventors: William M. Hiatt, Eagle, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,047

(22) Filed: Sep. 13, 2012

(65) Prior Publication Data

US 2013/0001780 A1    Jan. 3, 2013

Related U.S. Application Data

(60) Division of application No. 12/766,381, filed on Apr. 23, 2010, now Pat. No. 8,268,715, which is a division of application No. 11/535,414, filed on Sep. 26, 2006, now Pat. No. 7,719,120, which is a continuation of application No. 10/231,877, filed on Aug. 29, 2002, now Pat. No. 7,115,998.

(51) Int. Cl.
*H01L 23/48* (2006.01)
*H01L 23/52* (2006.01)
(Continued)

(52) U.S. Cl.
CPC ............ *H01L 24/12* (2013.01); *H01L 23/3114* (2013.01); *H01L 24/11* (2013.01); *H01L 24/16* (2013.01); *H01L 24/81* (2013.01); *H01L 2224/0231* (2013.01); *H01L 2224/0401* (2013.01); *H01L 2224/0558* (2013.01); *H01L 2224/05557* (2013.01); *H01L 2224/05644* (2013.01); *H01L 2224/1147* (2013.01); *H01L 2224/11474* (2013.01); *H01L 2224/11902* (2013.01); *H01L 2224/13006* (2013.01); *H01L 2224/13023* (2013.01); *H01L 2224/13076* (2013.01); *H01L 2224/13078* (2013.01); *H01L 2224/13099* (2013.01); *H01L 2224/13155* (2013.01); *H01L 2224/81203* (2013.01); *H01L 2224/81801* (2013.01); *H01L 2924/00013* (2013.01); *H01L 2924/0103* (2013.01); *H01L 2924/014* (2013.01); *H01L 2924/01006* (2013.01); *H01L 2924/01013* (2013.01);
(Continued)

(58) Field of Classification Search
None
See application file for complete search history.

(56) References Cited

U.S. PATENT DOCUMENTS 3,825,353 A    7/1974    Lora
4,205,099 A    5/1980    Jones et al.
(Continued)

*Primary Examiner* — Jarrett Stark
(74) *Attorney, Agent, or Firm* — Schwegman Lundberg & Woessner, P.A.

(57) ABSTRACT

An integrated circuit connection is describe that includes a first, securing member and a second, connection member. The first member, in an embodiment, is a spike that has a portion of its body fixed in a layer of an integrated circuit structure and extends outwardly from the integrated circuit structure. The second material is adapted to form a mechanical connection to a further electrical device. The second material (e.g., solder), is held by the first member to the integrated circuit structure. The first member increases the strength of the connection and assists in controlling the collapse of second member to form the mechanical connection to another circuit. The connection is formed by coating the integrated circuit structure with a patterned resist and etching the layer beneath the resist. A first member material (e.g., metal) is deposited. The resist is removed. The collapsible material is fixed to the first member.

14 Claims, 14 Drawing Sheets

(51) Int. Cl.
*H01L 29/40* (2006.01)
*H01L 23/00* (2006.01)
*H01L 23/31* (2006.01)

(52) U.S. Cl.
CPC ........... *H01L2924/01022* (2013.01); *H01L 2924/01027* (2013.01); *H01L 2924/01029* (2013.01); *H01L 2924/01033* (2013.01); *H01L 2924/01078* (2013.01); *H01L 2924/01079* (2013.01); *H01L 2924/01082* (2013.01); *H01L 2924/01322* (2013.01); *H01L 2924/14* (2013.01)

(56) References Cited

U.S. PATENT DOCUMENTS

| | | | |
|---|---|---|---|
| 5,496,775 | A | 3/1996 | Brooks |
| 5,513,430 | A | 5/1996 | Yanof et al. |
| 5,628,031 | A | 5/1997 | Kikinis et al. |
| 5,733,802 | A | 3/1998 | Inoue et al. |
| 5,753,973 | A | 5/1998 | Yasunaga et al. |
| 5,766,972 | A | 6/1998 | Takahashi et al. |
| 5,784,135 | A | 7/1998 | Inada et al. |
| 5,824,569 | A | 10/1998 | Brooks et al. |
| 5,864,174 | A | 1/1999 | Yamada et al. |
| 5,872,404 | A | 2/1999 | Lynch et al. |
| 5,888,850 | A | 3/1999 | Havens et al. |
| 5,891,795 | A | 4/1999 | Arledge et al. |
| 5,892,273 | A | 4/1999 | Iwasaki et al. |
| 5,908,317 | A | 6/1999 | Heo |
| 5,912,510 | A | 6/1999 | Hwang et al. |
| 5,933,713 | A | 8/1999 | Farnworth |
| 5,989,936 | A | 11/1999 | Smith et al. |
| 5,994,166 | A | 11/1999 | Akram et al. |
| 6,043,564 | A | 3/2000 | Brooks |
| 6,051,878 | A | 4/2000 | Akram et al. |
| 6,054,772 | A | 4/2000 | Mostafazadeh et al. |
| 6,107,109 | A | 8/2000 | Akram et al. |
| 6,136,689 | A | 10/2000 | Farrar |
| 6,177,725 | B1 | 1/2001 | Yamada et al. |
| 6,204,095 | B1 | 3/2001 | Farnworth |
| 6,222,265 | B1 | 4/2001 | Akram et al. |
| 6,288,335 | B1 | 9/2001 | Lee |
| 6,300,678 | B1 | 10/2001 | Suehiro et al. |
| 6,313,529 | B1 | 11/2001 | Yoshihara et al. |
| 6,329,609 | B1 * | 12/2001 | Kaja et al. ............ 174/262 |
| 6,333,209 | B1 | 12/2001 | Coico et al. |
| 6,351,030 | B2 | 2/2002 | Havens et al. |
| 6,355,507 | B1 | 3/2002 | Fanworth |
| 6,383,292 | B1 | 5/2002 | Brand |
| 6,399,425 | B1 | 6/2002 | Brand et al. |
| 6,404,044 | B2 | 6/2002 | Akram et al. |
| 6,420,212 | B1 | 7/2002 | Mostafazadeh |
| 6,459,145 | B1 | 10/2002 | Yamada et al. |
| 6,461,892 | B2 | 10/2002 | Beroz |
| 6,461,894 | B2 | 10/2002 | Brand |
| 6,498,052 | B2 | 12/2002 | Brand |
| 6,528,890 | B1 | 3/2003 | Brand |
| 6,541,848 | B2 | 4/2003 | Kawahara et al. |
| 6,551,863 | B2 | 4/2003 | Johnson et al. |
| 6,562,663 | B2 | 5/2003 | Scheifers et al. |
| 6,569,755 | B2 | 5/2003 | Yamada et al. |
| 6,583,503 | B2 | 6/2003 | Akram et al. |
| 6,642,136 | B1 | 11/2003 | Lee et al. |
| 6,673,649 | B1 | 1/2004 | Hiatt et al. |
| 6,686,268 | B2 | 2/2004 | Farnworth |
| 6,700,079 | B2 | 3/2004 | Bogursky et al. |
| 6,706,554 | B2 | 3/2004 | Ogura |
| 6,713,318 | B2 | 3/2004 | Maeda et al. |
| 6,723,627 | B1 | 4/2004 | Kariyazaki et al. |
| 6,734,566 | B2 | 5/2004 | Honda |
| 6,784,087 | B2 | 8/2004 | Lee et al. |
| 6,847,121 | B2 | 1/2005 | Dotta et al. |
| 6,870,276 | B1 | 3/2005 | Moxham |
| 6,946,725 | B2 | 9/2005 | Hacke |
| 6,998,711 | B1 | 2/2006 | Farrar |
| 7,115,998 | B2 | 10/2006 | Hiatt et al. |
| 7,208,841 | B2 | 4/2007 | Wang et al. |
| 7,220,657 | B2 | 5/2007 | Ihara et al. |
| 7,446,028 | B2 | 11/2008 | Hiatt et al. |
| 7,462,783 | B2 | 12/2008 | Howard et al. |
| 7,719,120 | B2 | 5/2010 | Hiatt et al. |
| 8,268,715 | B2 | 9/2012 | Hiatt et al. |
| 2001/0040290 | A1 | 11/2001 | Sakurai et al. |
| 2002/0014685 | A1 | 2/2002 | Tsukahara |
| 2002/0034581 | A1 | 3/2002 | Farrar et al. |
| 2002/0053467 | A1 * | 5/2002 | Gebauer et al. ............ 174/260 |
| 2002/0100976 | A1 | 8/2002 | Hui et al. |
| 2003/0025172 | A1 | 2/2003 | Grube et al. |
| 2003/0027463 | A1 * | 2/2003 | Miyamoto et al. ............ 439/876 |
| 2004/0043675 | A1 | 3/2004 | Hiatt et al. |
| 2005/0255633 | A1 | 11/2005 | Hacke |
| 2006/0001141 | A1 | 1/2006 | Hiatt et al. |
| 2006/0021795 | A1 | 2/2006 | Howard et al. |
| 2006/0280919 | A1 | 12/2006 | Urashima et al. |
| 2007/0018321 | A1 | 1/2007 | Hiatt et al. |
| 2008/0117225 | A1 | 5/2008 | Wegenkittl et al. |
| 2008/0272794 | A1 | 11/2008 | Grube et al. |
| 2009/0061566 | A1 | 3/2009 | Howard et al. |
| 2010/0135554 | A1 | 6/2010 | Kohlmann et al. |
| 2010/0203721 | A1 | 8/2010 | Hiatt et al. |
| 2010/0275145 | A1 | 10/2010 | Nijlunsing et al. |

* cited by examiner

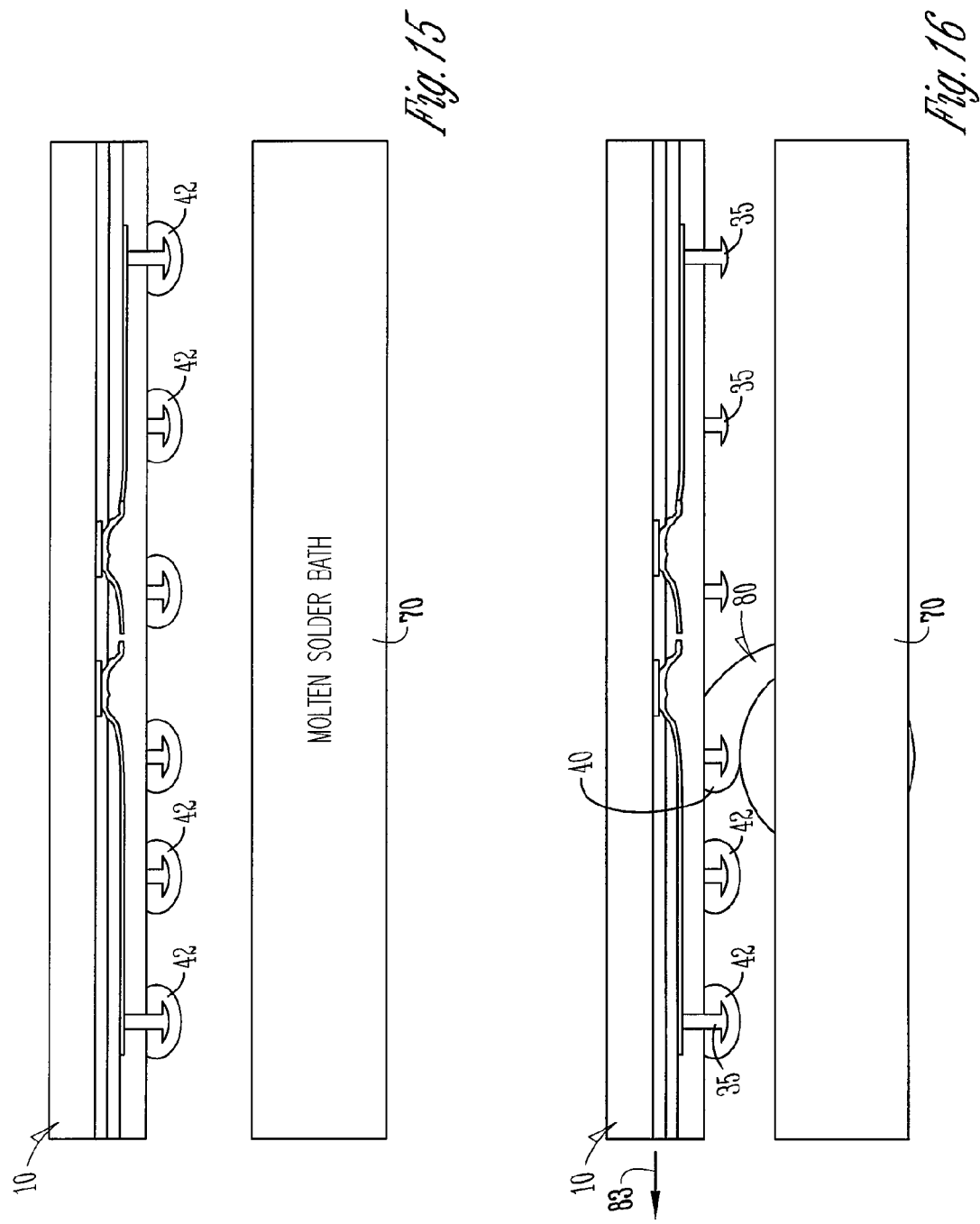

MULTI-COMPONENT INTEGRATED CIRCUIT CONTACTS

CROSS REFERENCE TO RELATED APPLICATIONS

This application is a Divisional of U.S. application Ser. No. 12/766,381, filed Apr. 23, 2010, which is a divisional of Ser. No. 11/535,414, filed Sep. 26, 2006, which is a Continuation of U.S. application Ser. No. 10/231,877, filed Aug. 29, 2002, now issued as U.S. Pat. No. 7,115,998, which these applications are incorporated herein by reference in their entirety.

TECHNICAL FIELD

The present invention relates generally to integrated circuit contacts, and in particular to contact structures and methods for fabricating the contacts.

BACKGROUND

Wafers are fabricated with a plurality of dies each having a plurality of integrated circuit elements therein. A die represents one individual chip that must be separated from adjacent dies before packaging. Contacts are added to the die before packaging the chip. One type of contact is a solder ball. Solder balls are used to mount the integrated circuit chip to a substrate. In today's technological environment, there is a continuous desire to increase integration of greater numbers of circuits onto a single semiconductor chip. At the same time there is a requirement to increase performance of the chip, whether it is a memory chip, processor chip, telecommunication chip or other integrated circuit chip. As more functions are integrated into a chip, the number of interconnections to other chips and/or electrical devices increases. Often, the goal is to provide the chip with as many input/output ("I/O") contacts or terminals as possible. Accordingly, the solder bumps are manufactured as small as possible to increase the number of solder bumps. However, decreasing the size of the solder bumps decreases their strength, for example, shear strength. Such solder bumps are more likely to fail. This may decapitate the chip.

For the reasons stated above, for other reasons stated below, and for other reasons which will become apparent to those skilled in the art upon reading and understanding the present specification, there is a need in the art for improved integrated circuit contacts or terminals.

BRIEF DESCRIPTION OF THE DRAWINGS

FIG. 15 is an elevational view of the FIG. 11 substrate structure during a subsequent fabrication step according the present invention.

FIG. 16 is an elevational view of the FIG. 11 substrate structure during fabrication according the present invention.

DETAILED DESCRIPTION

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

It is noted that for purposes of interpreting this disclosure and the claims that follow, the special reference terms "on", "over", "above", "beneath" and the like are utilized to describe relative orientations of various elements to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

Figure 1:
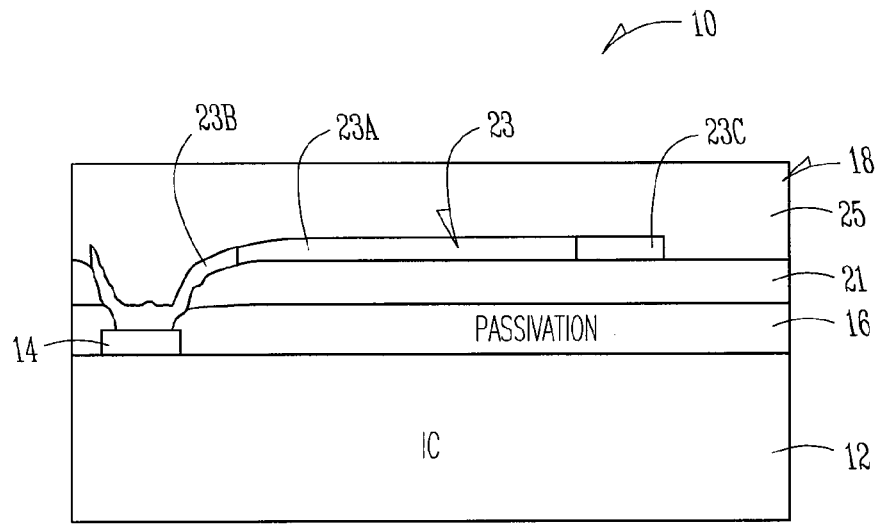
FIG. 1 is a fragmentary cross-sectional view of a substrate structure during a fabrication step according to the present invention.

FIG. 1 shows a substrate assembly 10 that includes an integrated circuit layer 12. In an embodiment, the integrated circuit layer 12 is a die. In an embodiment, the integrated circuit layer 12 includes a semiconductor wafer. In an embodiment, the integrated circuit layer 12 is a substrate. Integrated circuit layer 12 includes an integrated circuit connected to a conductive bond pad 14. In an embodiment, the bond pad 14 includes a metal. It will be understood that substrate assembly 10 is simplified to better illustrate the present invention. For example, only one bond pad 14 is shown, however, an integrated circuit typically has a plurality of bond pads to provide I/O terminals.

The integrated circuit layer 12, in an embodiment, includes an integrated circuit memory device. In an embodiment, the memory device includes address and data interconnects that are connected to bond pads, such as bond pad 14. The memory device, in an embodiment, includes a dynamic random access memory (DRAM). In other embodiments, the memory circuit includes at least one of SRAM (Static Random Access Memory) or Flash memories. Additionally, the DRAM could be a synchronous memory device such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies as known in the art. The integrated circuit layer 12, in an embodiment, includes logic circuits. In an embodiment, the logic circuits are address decoders. In an embodiment, the logic circuits are data processing circuits. In an embodiment, the logic circuits include microprocessors. It will be further recognized that the integrated circuit layer 12, in an embodiment, includes both logic circuits and memory circuits. In an embodiment, the integrated circuit layer includes a system-on-a-chip. It will be recognized that the present invention is applicable to any electronic device that is mechanically or electrically connectable to another pad.

An insulating layer 16 is formed on the upper surface of the integrated circuit layer 12. The insulating layer 16 includes an aperture open to bond pad 14. In an embodiment, the insulating layer 16 covers the entire integrated circuit layer 12 except over bond pad 14. That is, the insulating layer 16 does not cover the bond pad 14. In an embodiment, the insulating layer 16 is a passivation layer that essentially encloses the integrated circuit layer 12. In an embodiment, the insulating layer 16 is a passivation layer that essentially covers the top surface of the integrated circuit layer 12. In an embodiment, insulating layer 16 includes a glass material. In an embodiment, insulating layer 16 includes inorganic polymers. In an embodiment, insulating layer 16 includes benzocyclobutenes (BCB). In an embodiment, insulating layer 16 includes polymides (PI). In an embodiment, insulting layer 16 includes at least one of silicon dioxide, silicon nitride, or silicon oxynitride. In an embodiment, insulating layer 16 includes organic polymers.

A redistribution level 18 is formed on insulating layer 16. Redistribution level 18 is adapted to provide an electrical connection from the bond pad 14 to an external electrical circuit. Redistribution level 18 provides the electrical connections spaced outwardly from bond pads in an embodiment. Redistribution level 18 includes a further insulating layer 21 formed on insulating layer 16. Insulating layer 21 includes, in an embodiment, a dielectric material. In an embodiment, insulating layer 21 includes inorganic polymers. In an embodiment, insulating layer 21 includes benzocyclobutenes (BCB). In an embodiment, insulating layer 21 includes polymides (PI). In an embodiment, insulating layer 21 includes poly benzobisoxazole (PBO). In an embodiment, insulating layer 21 includes organic polymers. The insulating layer 21 is patterned to form a recess that receives a conductive trace 23. Trace 23 is connected to and extends outwardly, away from bond pad 14. In an embodiment, conductive trace 23 is deposited on top of insulating layer 21. For example, a lift off process is used to fabricate trace 23. A liftoff layer is formed in a pattern on insulating layer 21 to cover portions of insulating layer 21 and expose portions of insulating layer 21. The conductive trace 23 is deposited as a layer on the liftoff layer and the exposed portions of insulating layer 21. The liftoff layer is stripped away along with the portion of the conductive trace layer on the liftoff layer. The portion of the conductive trace layer on insulating layer 21 remains to form trace 23. In another example, a seed layer is deposited on the portions of the insulating layer where the trace 23 will be formed. The material of the trace is deposited on, e.g., grows only on, the seed layer to form the trace 23. In an embodiment, a layer of metal to form the trace 23 is deposited to substantially cover layer 21. A resist layer is formed on the metal layer. The resist is patterned so that the area of the metal layer that will form the trace is covered by the resist. The exposed area of the metal layer is etched. The resist layer is removed, e.g., dissolved. The trace 23 remains. It will also be appreciated that the trace, in embodiments, is formed by a damascene process or chemical-mechanical polishing process. In an embodiment, conductive trace 23 includes a metal. In an embodiment, the conductive trace includes copper. In an embodiment, the conductive trace includes aluminum. In an embodiment, the conductive trace includes a titanium coating on top of the aluminum. In an embodiment, the conductive trace includes an elongate aluminum body 23A with end caps 23B and 23C at respective ends of the body. One of the caps 23B directly contacts bond pad 14. The other cap 23C is at the other end of the body 23A. Redistribution level 18 further includes a further insulating layer 25 on conductive trace 23 and insulating layer 21. In an embodiment, insulating layer 25 completely covers the top surface of the conductive trace 23 and insulating layer 21. In an embodiment, insulating layer 25 includes inorganic polymers. In an embodiment, insulating layer 25 includes benzocyclobutenes (BCB). In an embodiment, insulating layer 25 includes polymides (PI). In an embodiment, insulating layer 25 includes poly benzobisoxazole (PBO). In an embodiment, insulating layer 25 includes organic polymers. The layers 12, 14, 16, 21, 23, and 25 form a packaged integrated circuit device or structure.

Figure 2:
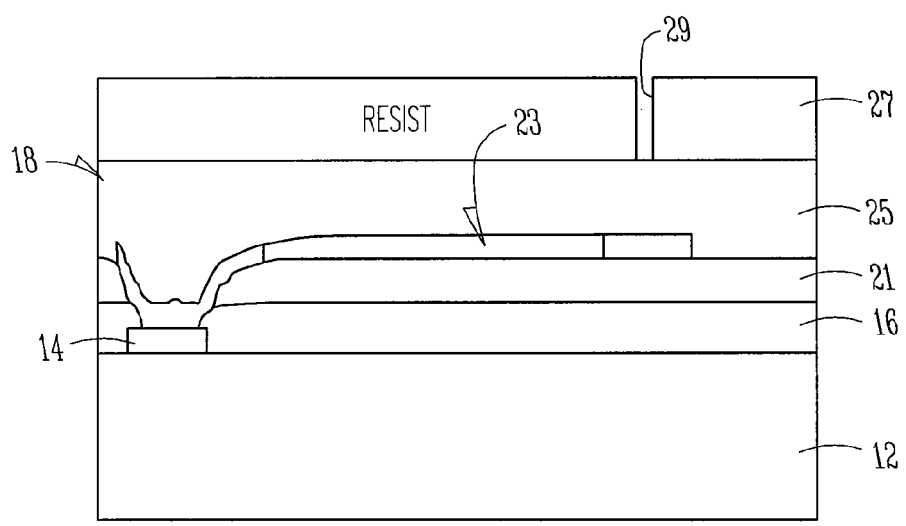
FIG. 2 is a fragmentary cross-sectional view of a substrate structure during a subsequent fabrication step according to the present invention.
Figure 3:
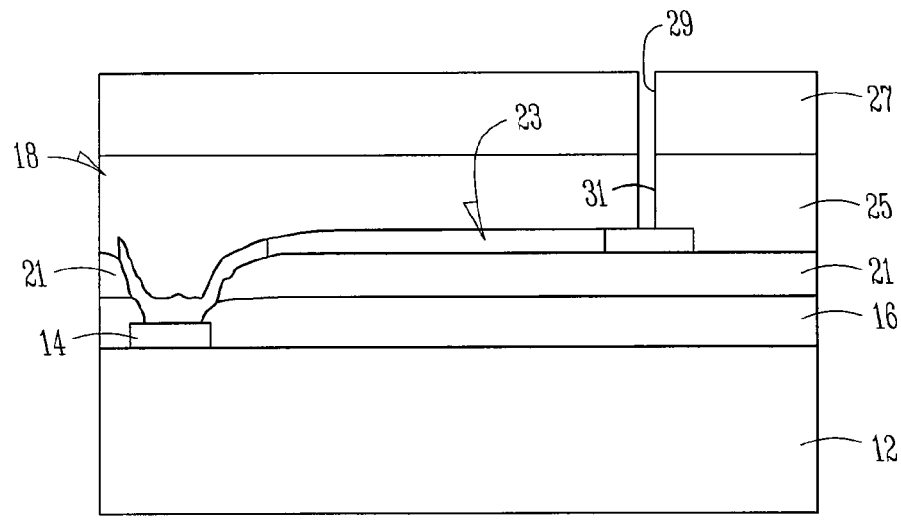
FIG. 3 is a fragmentary cross-sectional view of a substrate structure during a subsequent fabrication step according to the present invention.

FIG. 2 shows a further fabrication step according to the present invention. A resist layer 27 is deposited on upper insulating layer 25. Resist layer 27 is patterned to include an aperture 29 through resist layer 27 to insulating layer 25. In an embodiment, the aperture 29 is directly above the trace 23. In an embodiment, aperture 29 is vertically aligned with or directly above the cap 23C that is remote from bond pad 14. A via 31 in the upper insulating layer 25 is formed vertically aligned with the resist aperture 29 (FIG. 3). In an embodiment, an etchant, which is resisted by resist layer 27 and which removes insulating layer 25, forms via 31. The trace 23 acts as an etch stop of the etchant. Via 31 extends through insulating layer 25 to trace 23 and is vertically aligned with aperture 29.

In the embodiment with the trace 23 including a coating of titanium, the titanium is removed. This procedure does not require extra masking steps as the titanium is removed through resist aperture 29 and via 31. In an embodiment, the titanium is etched. In an embodiment, a plasma etch is used to remove the titanium. In an embodiment, a zincate bath is used to remove the titanium. The underlying aluminum portion of the trace is now exposed through aperture 29 and via 31. This removes the titanium, which is not does not bond well to nickel, and exposes the aluminum, which bonds catalytically with the nickel. In an embodiment, nickel is used to form a component of the connection as explained herein.

Figure 4A:
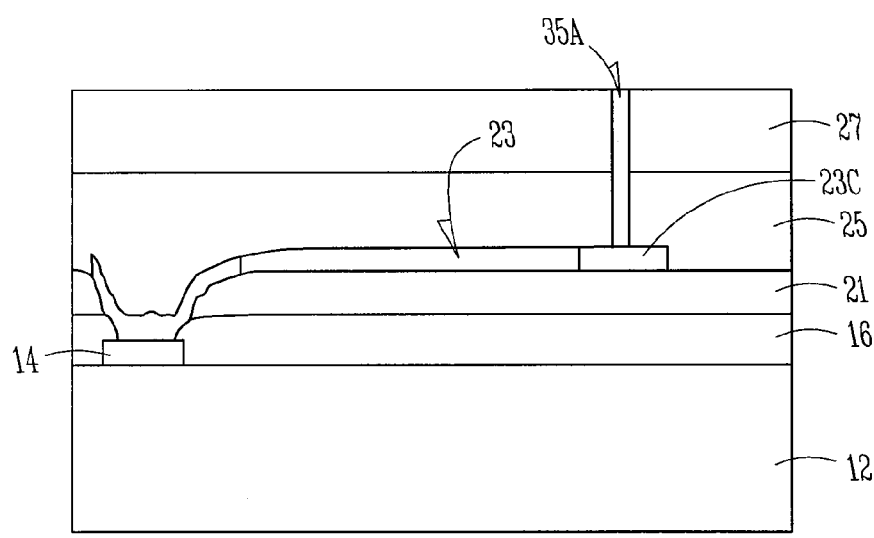
FIG. 4A is a fragmentary cross-sectional view of a substrate structure during a subsequent fabrication step according to an embodiment of the present invention.
Figure 5A:
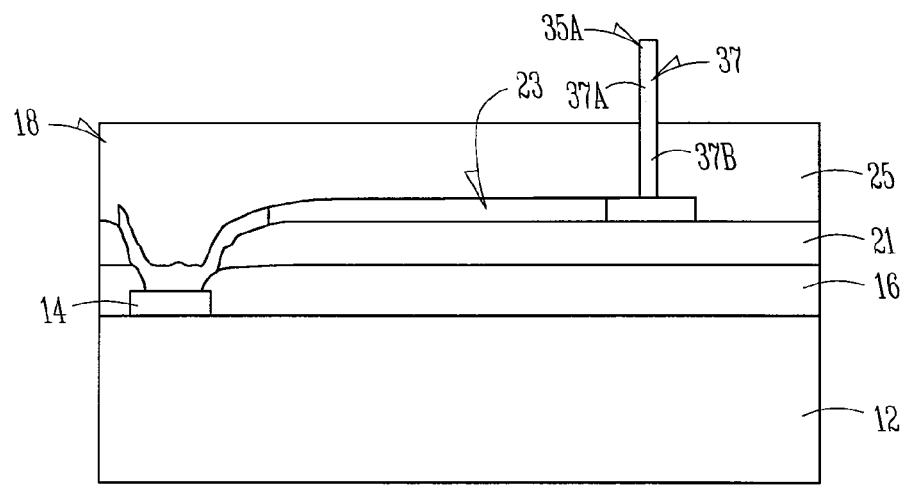
FIG. 5A is a fragmentary cross-sectional view of a substrate structure during a subsequent fabrication step according to an embodiment of the present invention.

FIG. 4A shows a further fabrication step of an embodiment of the present invention. An integrated circuit, connection component 35A of the connection of the present invention is formed in the resist aperture 29 and insulating layer via 31. Integrated circuit component 35A extends from the top surface of resist layer 27 through insulating layer 25. Component 35A has a height that is greater than the thickness of insulating layer 25. Thus, component 35A has an upper end that is above the upper surface of layer 25. In an embodiment, component 35A extends at least partially through the resist layer 27. In an embodiment, component 35A extends essentially to the upper surface of the resist layer 27 such that its upper end is essentially co-planar with the upper surface of the resist layer 27. Component 35A, at a lower end, directly contacts trace 23. In an embodiment, component 35 contacts trace cap 23C. In an embodiment, component 35A is formed by a metal plating process. In an embodiment, component 35A is a metal. In an embodiment, component 35A includes nickel. In an embodiment, component 35A is essentially pure nickel. Nickel is suited for the connection component as it as sufficient strength and fabrication characteristics. Nickel provides an improved shear strength to an integrated circuit connection. Further, nickel is malleable which allows the component 35A to be repeated stressed without failing. In an embodiment, the aluminum trace is activated in a zincate bath. This allows the nickel to catalytically bond to the aluminum trace. Further, this does not require an electrolytic fabrication process. In an embodiment, component 35A includes copper. In an embodiment, component 35A includes non-metal conductors. After the component 35A is formed, the resist layer 27 is removed or stripped (FIG. 5A).

Component 35A has an elongate body 37 with a lower end directly contacting trace 23 and an upper end positioned above the insulating layer 25. In an embodiment, the upper end of body 37 is positioned at the upper surface of the resist layer 27. The upper end of body 37 is spaced upwardly from the top surface of layer 25. In an embodiment, body 37 is malleable. The component body 37 includes a first body portion 37A that is free standing and connected to a second body portion 37B. The second body portion 37B is fixed in aperture 31 of the insulating layer 25. Stated another way, the first body portion 37A is cantilevered from the second body portion 37B and layer 25. In an embodiment, component 35A has an essentially right parallelepiped or right cylindrical shape in embodiments of the present invention. In an embodiment, the component 35A has a height greater than or equal to about 32 microns. In an embodiment, the component 35A has a height greater than 50 microns. In an embodiment, component 35A has a height in the range of about 100 to about 500 microns. It will be appreciated that the component 35A is scalable dependent on the application.

Figure 4B:
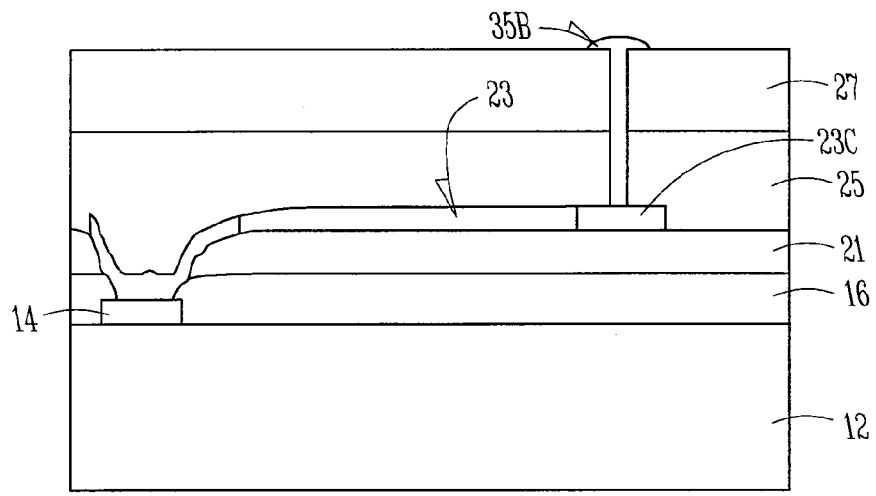
FIG. 4B is a fragmentary cross-sectional view of a substrate structure during a subsequent fabrication step according to another embodiment of the present invention.
Figure 5B:
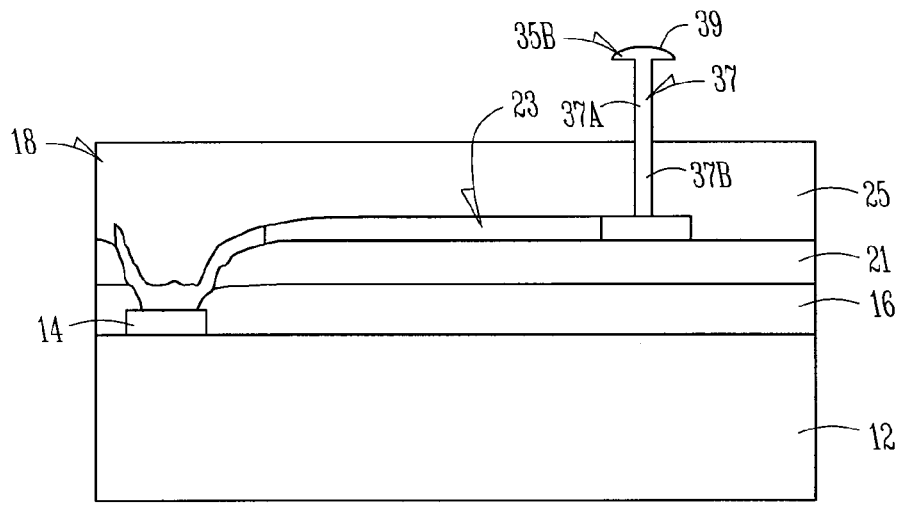
FIG. 5B is a fragmentary cross-sectional view of a substrate structure during a subsequent fabrication step according to another embodiment of the present invention.

FIG. 4B shows another embodiment of the present invention that is similar to the embodiment shown in FIG. 4A except the connection component 35B extends through both the resist layer 27 and insulating layer 25. The formation process continues so that component 35B includes a head 39 formed on the upper surface of resist layer 27. Connection 35B has a generally pin, spike or nail shape (FIG. 5B). Component 35B has an elongate body 37 with a lower end directly contacting trace 23 and an upper end connected to a head 39. In an embodiment, the body 37 is malleable. The component body 37 includes a first body portion 37A that is free standing and connected to a second body portion 37B. The second body portion 37B is fixed in aperture 31 of the insulating layer 25. Stated another way, the first body portion 37A is cantilevered from the second body portion 37B and layer 25. The head 39 includes conducting material that was deposited on the upper surface of resist layer 27 when the connection component 35 was formed. The resist layer 27 is stripped (FIG. 5B). Head 39 is spaced upwardly from the top surface of layer 25. As a result, component 35 has an essentially nail or spike shape in an embodiment of the present invention. The head 39 has a first dimension that is greater than the width of the body 37. The head 39 extends radially outwardly from the center axis of the body 37. In an embodiment, the component body 37 has a width of about 5 microns. The head 39 has a width in a range of about 6 microns to about 10 microns. In an embodiment, the component 35B has a height greater than 50 microns. In an embodiment, component 35B has a height in the range of about 100 to about 500 microns. It will be appreciated that the component 35B is scalable dependent on the application.

Figure 6:
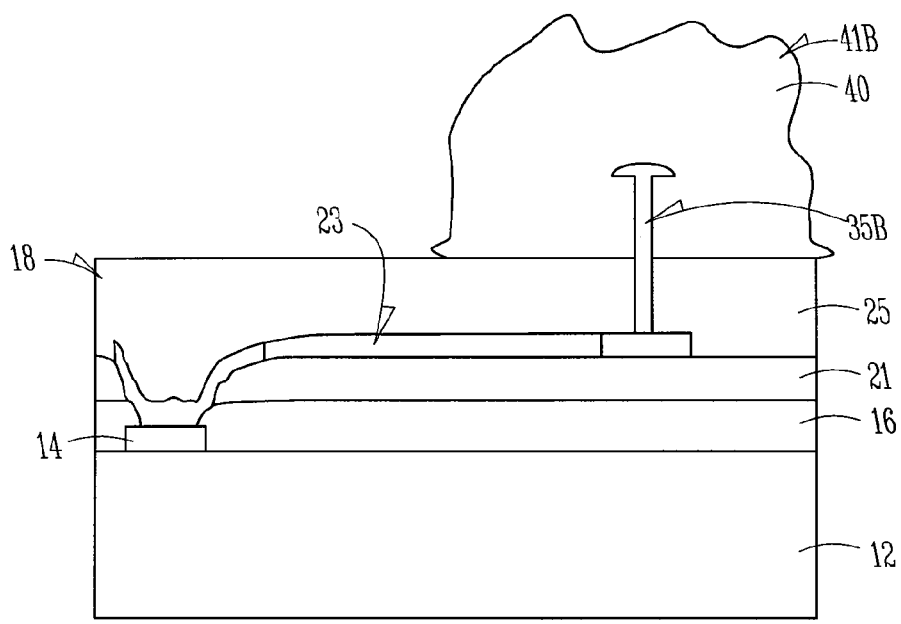
FIG. 6 is a fragmentary cross-sectional view of a substrate structure during a subsequent fabrication step according to the present invention.

FIG. 6 shows a further fabrication step of an embodiment of the present invention. A contact forming material 40 is placed on the layer 25 over the component 35B to form a contact assembly 41B. Contact forming material 40 is a further component of the contact of the present invention. Component 35B buried within material 40. It will be appreciated that other forms of the first component, such as components 35A and 35C-35E, as described herein could be used with material 40. In an embodiment, the contact material 40 include a solder paste. In an embodiment, the solder paste includes controlled-collapse chip connection (C-4) materials. In an embodiment, the solder paste includes tin and lead (Sn and Pb). In an embodiment, the solder paste includes an eutectic material. Contact material 40 is deposited in a non-uniform shape. Contact assembly 41B is heated to reflow the contact material 40 to form a contact ball 42 at each location defined by at least one component 35 (FIG. 7B). The component 35B remains buried within the contact ball 42. Component 35B extends radially inwardly into the contact ball 42. Component 35B extends into the solder ball less than half the diameter of the solder ball 42. In an embodiment, component 35B extends into the solder ball 42 less than one-third the diameter of the solder ball 42. In an embodiment, component 35B extends into the solder ball 42 about 25% of the diameter of the solder ball 42. In an embodiment, the component has a height above layer 25 of about 5 microns. In an embodiment, the solder ball has a height or diameter of about 25 microns. This allows solder ball 42 room to collapse and not have the other contact abut the component 35B. In an embodiment, component 35B is adapted to assist in control the collapse of ball 42B during its joining to the other contact (not shown). In an embodiment, the connection assembly 41B has a diameter of less than 100 microns (:m). In an embodiment, the connection assembly 41B has a diameter of less than 90 microns (:m). In an embodiment, the ball 42B has a diameter that is greater than the height of portion of the component 35B extending above the upper surface. In an embodiment, the ball 42B has a radius that is greater than the height of portion of the component 35B extending above the upper surface. In an embodiment, the ball 42B has a diameter that is less than the height of portion of the component 35B extending above the upper surface. In an embodiment, the ball 42B has a radius that is less than the height of portion of the component 35B extending above the upper surface.

Figure 7A:
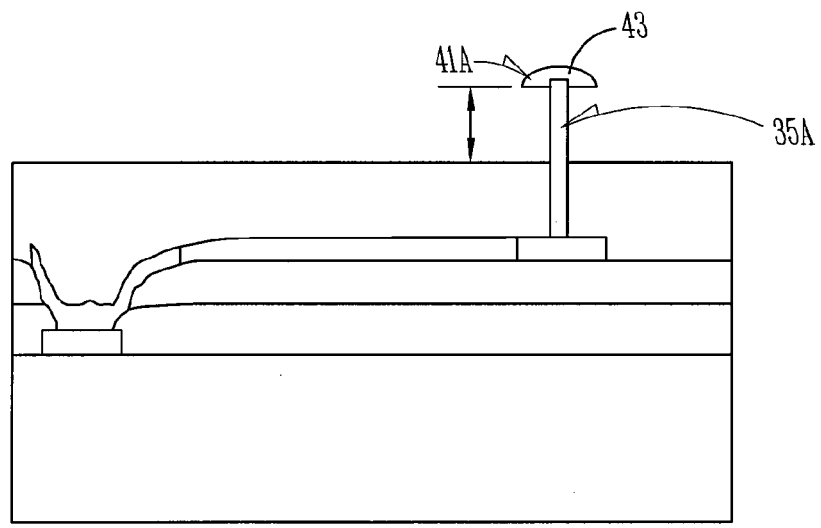
FIG. 7A is a fragmentary cross-sectional view of a substrate structure according to an embodiment of the present invention.
Figure 7B:
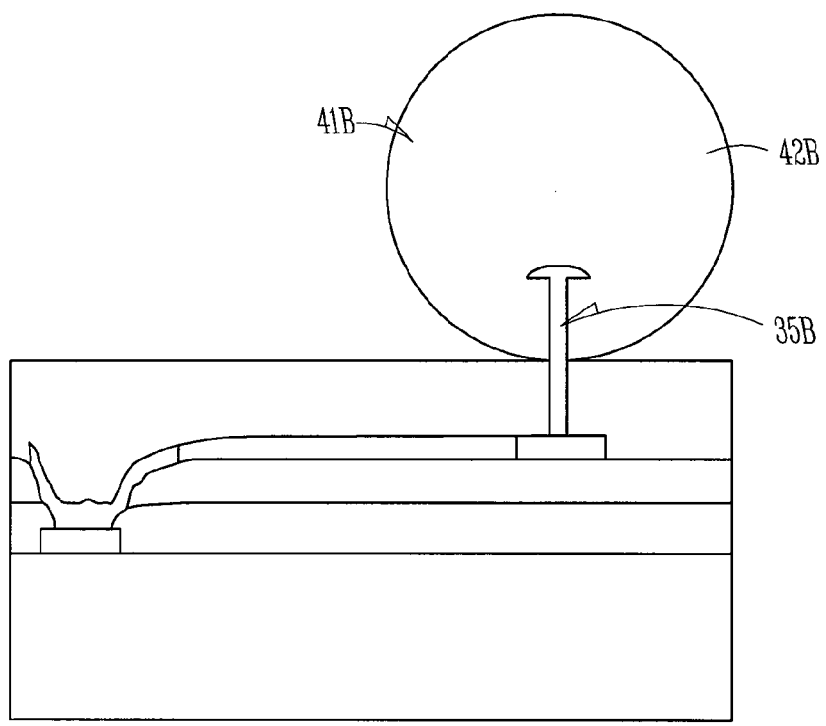
FIG. 7B is a fragmentary cross-sectional view of a substrate structure according to an embodiment of the present invention.

FIG. 7A shows an embodiment of a contact assembly 41A of the present invention. Assembly 41A includes component 35A with a collapsible component 43. Collapsible component 43 is placed on the free end of component 35A remote from the upper surface of insulating layer 25. That is, collapsible component 43 does not contact the below integrated circuit assembly. The collapsible component 43 has a dimension that is less than the height of the portion of the component 35A above the integrated circuit assembly. In an embodiment, the dimension is diameter. In an embodiment, the dimension is radius. In an embodiment, the dimension is height. In an embodiment, the dimension is width. In an embodiment, collapsible component 43 includes a solder. In an embodiment, collapsible component includes tin and lead (Sn and Pb). In an embodiment for forming the collapsible component 43 on component 35A, the resist layer 27 is left on layer 25 until the collapsible material 43 is adhered to the end of the component 35A. Thereafter, the resist layer 27 is stripped from the IC structure. In an embodiment, only the free end of the component 35A is dipped into a collapsible material bath.

Figure 8:
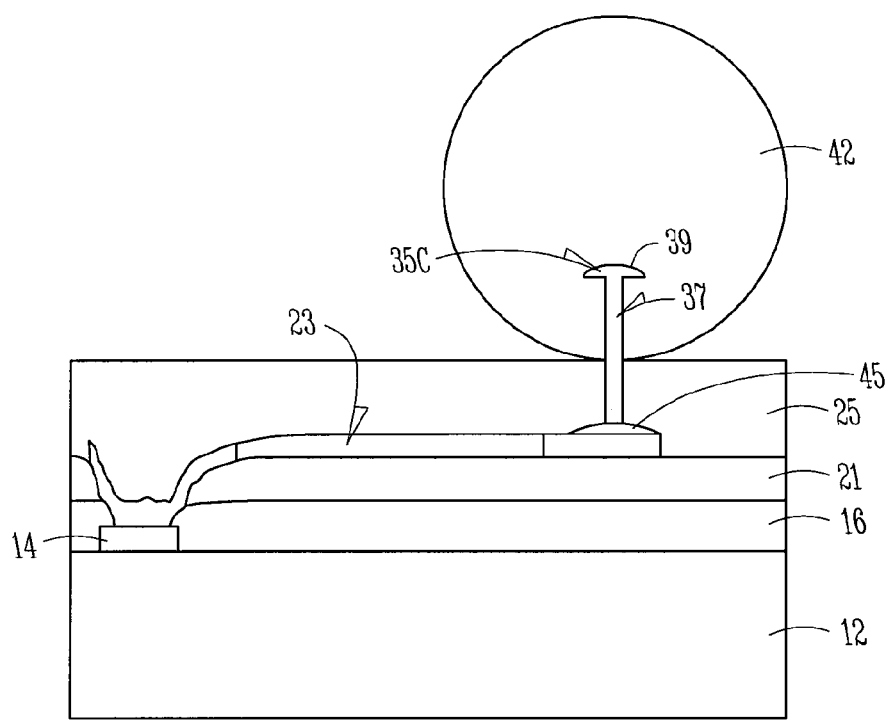
FIG. 8 is a fragmentary cross-sectional view of a substrate structure according to an embodiment of the present invention.

FIG. 8 shows an embodiment of the connection according to the present invention. Generally similar elements in the drawing figures have the same reference numbers as previously recited. Component 35C is similar to the component described above except it includes a base 45 buried within the integrated circuit assembly. In an embodiment, base 45 is positioned at the lower end of the component body 37. In an embodiment, base 45 is generally beneath layer 25. Base 45 is formed on the conductive trace 23. In an embodiment, the insulating layer 25 is formed after the base 45 is deposited on trace 23. In an embodiment, base 45 includes a metal. In an embodiment, base 45 includes nickel. Base 45 includes a dimension that is greater than a corresponding dimension of the component body 37. In an embodiment, the dimension of the base 45 that is greater is its width and/or diameter. In an embodiment, base 45 includes a dimension that is greater than a corresponding dimension of the component head 39. In an embodiment, the dimension of the base 45 that is greater is its width and/or diameter. Base 45 is adapted to act as an anchor to secure the component 35 and component ball 42 to the device assembly 10. The base 45 is formed, in an embodiment, by placing a sacrificial layer on layer 21 and trace 23. The sacrificial layer is patterned with an aperture for the base. The material of the base, i.e., a conductor, is deposited in at least the sacrificial layer aperture to form the base. The sacrificial layer and any of the base material on the sacrificial layer is stripped off layer 21 and trace 23. Thereafter, the connection component 35C is formed as described herein. While FIG. 8 shows component 35C as having a head 39, it is within the scope of the present invention to form the FIG. 8 embodiments without head 39.

Figure 9:
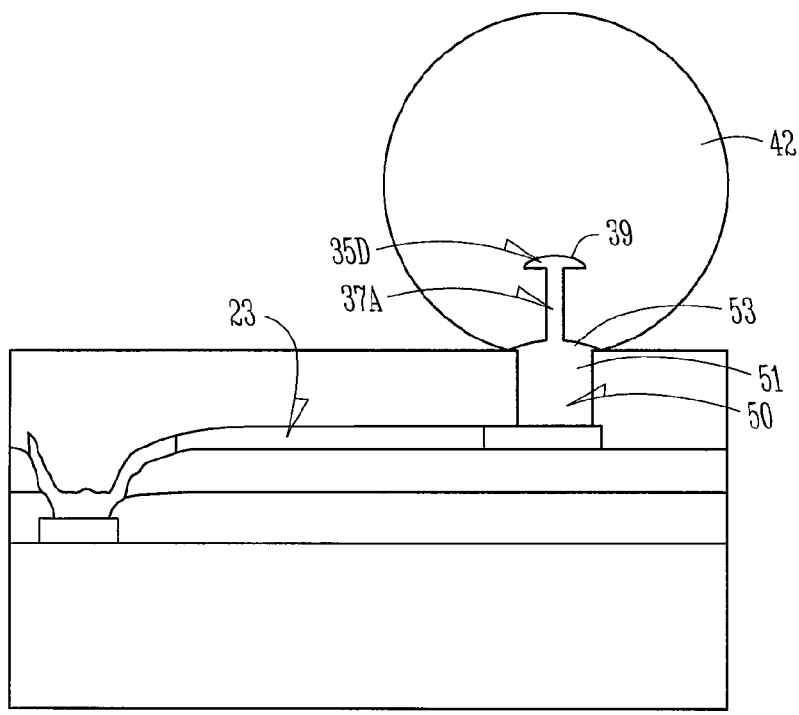
FIG. 9 is a fragmentary cross-sectional view of a substrate structure according to an embodiment of the present invention.

FIG. 9 shows an embodiment of the connection according to the present invention. Component 35D includes a stud 50 connected to the lower end of the upper portion 37A of component body 37. The stud 50 extends through layer 25 with a body 51 in layer 25 and a cap 53 above layer 25. In an embodiment, the stud 50 has an upper surface essentially co-planar with the upper surface of layer 25. In an embodiment, stud 50 includes an upper surface below upper surface of layer 25. In an embodiment, the stud body 51 includes a dimension that is greater than a corresponding dimension of the component body 37A, which extends upwardly from stud body 51. In an embodiment, the dimension of the body 51 that is greater is its width and/or diameter. In an embodiment, body 51 includes a dimension that is greater than a corresponding dimension of the component head 39. In an embodiment, the dimension of the body 51 that is greater is its width and/or diameter. Body 51 is adapted to act as an anchor to secure the component to the device assembly 10. In an embodiment, the stud cap 53 includes a dimension that is greater than a corresponding dimension of the component body 37A. In an embodiment, the dimension of cap 53 that is greater is its width and/or diameter. In an embodiment, cap 53 includes a dimension that is greater than a corresponding dimension of the component head 39. In an embodiment, the dimension of the cap 53 that is greater is its width and/or diameter. In an embodiment, stud cap 53 includes a dimension that is greater than a corresponding dimension of stud body 51. In an embodiment, the dimension of cap 53 that is greater is its width and/or diameter. While FIG. 9 shows component 35D as having a head 39, it is within the scope of the present subject matter to form the FIG. 9 embodiments without head 39.

Figure 10:
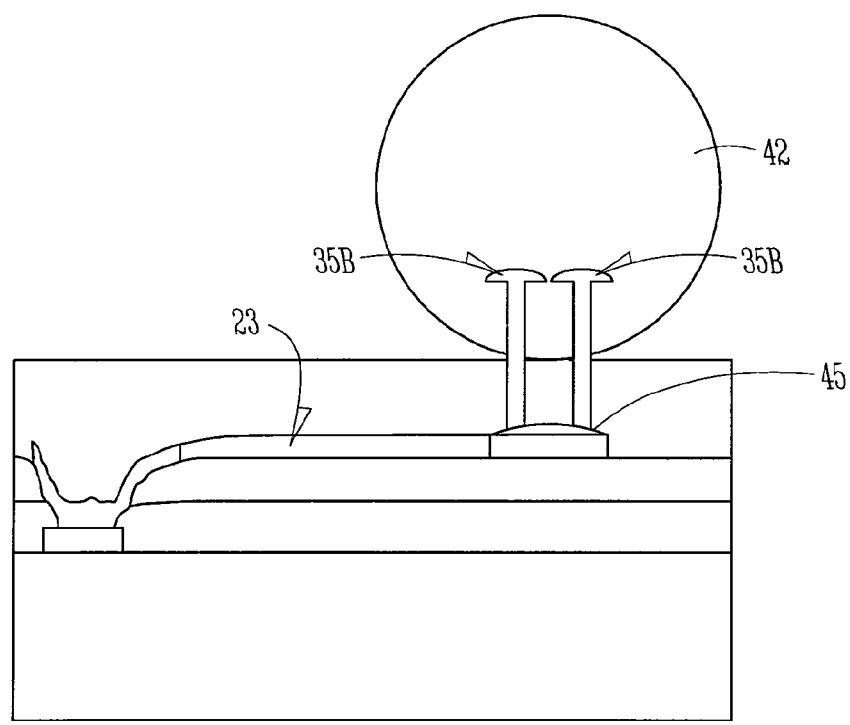
FIG. 10 is a fragmentary cross-sectional view of a substrate structure according to an embodiment of the present invention.

FIG. 10 shows an embodiment of the connection according to the present invention, which includes a plurality of components 35A. Components 35A are each attached to a same base 45. In an embodiment, components 35A do not include a base. In an embodiment, the components 35A have the same dimensions. In an embodiment, the components 35A have different dimensions. For example, one of the components 35A is taller than at least one of the other components so that it extends further into the device assembly 10 or into the component ball 42. In an embodiment, one of the components 35A has a width or diameter greater than at least one of the other components. While FIG. 10 shows components 35D as having a head 39, it is within the scope of the present invention to form the FIG. 10 embodiments without head 39.

Figure 11:
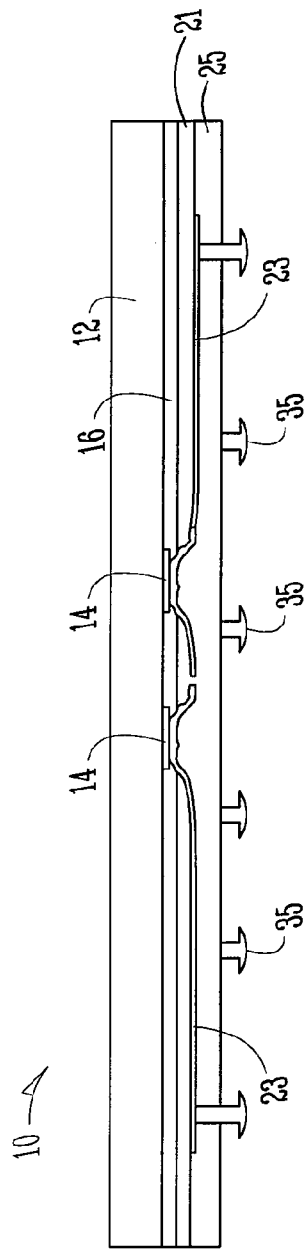
FIG. 11 is an elevational view of a substrate structure according to an embodiment of the present invention.
Figure 12:
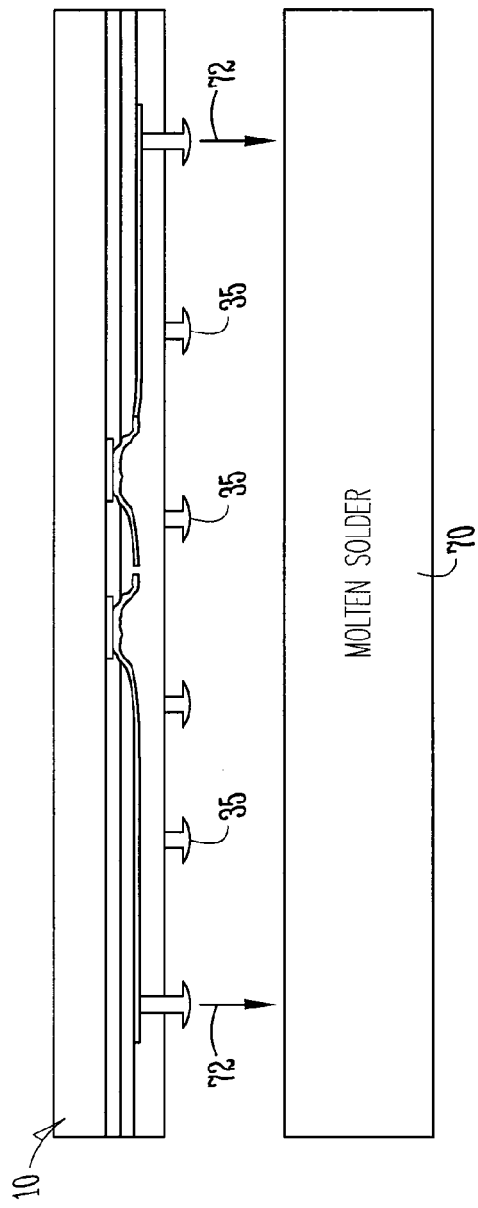
FIG. 12 is an elevational view of the FIG. 11 substrate structure during a fabrication step according the present invention.
Figure 13:
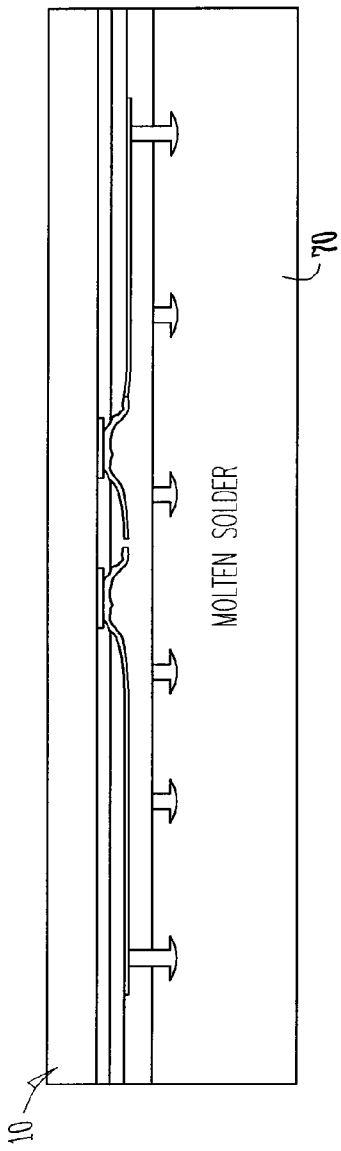
FIG. 13 is an elevational view of the FIG. 11 substrate structure during a subsequent fabrication step according the present invention.
Figure 14:
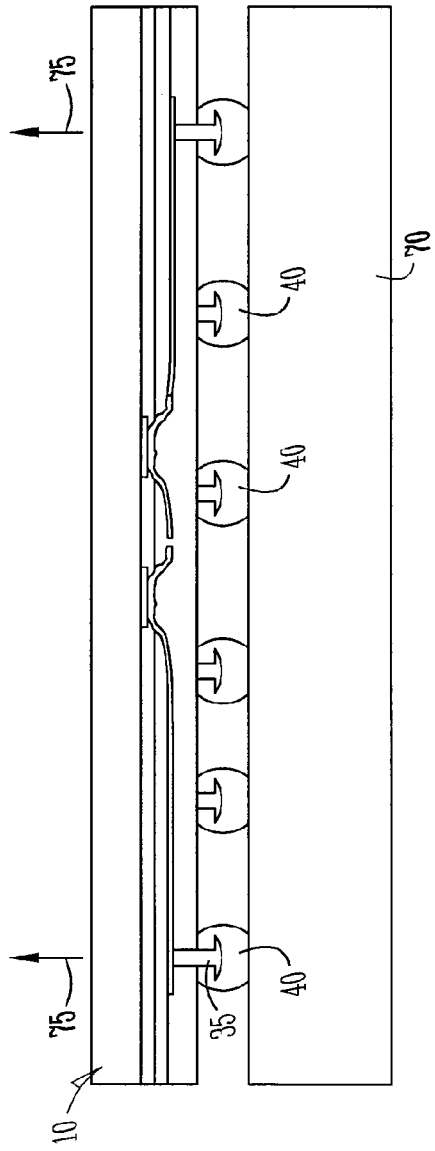
FIG. 14 is an elevational view of the FIG. 11 substrate structure during a subsequent fabrication step according the present invention.

FIG. 11 shows an embodiment of the present invention as an assembly 10 that includes integrated circuit layer 12, bond pads 14, passivation layer 16, insulating layers 21 and 25, conductive trace 23, and components 35. It will be appreciated that FIG. 11 is inverted relative to FIG. 7. To deposit connection material, such as solder paste, on the components 35, the assembly 10 is positioned adjacent a component material source 70 (FIG. 12). In an embodiment, the component material source 70 is a molten solder bath. The assembly 10 is moved relative to source 70 as indicated by arrow 72. The components 35 contact the component material (FIG. 13). In an embodiment, components 35 are dipped into source 70. In an embodiment, components 35 are rolled into source 70. Assembly 10 is withdrawn from source 70 generally along arrow 75 in FIG. 14. Conductive material 40 from source 70 adheres to the components 35. In an embodiment, material 40 encases components 35. In an embodiment, the surface of the assembly 10, namely, the surface of layer 25 is coated so that material 40 does not adhere to the surface. In an embodiment, material 40 takes a generally spherical shape as the components 35 are withdrawn. In an embodiment, material 40 is heated so that it reflows into a generally spherical shape (FIG. 15).

In an embodiment, the components 35 are only partially dipped into the collapsible material source 70. Thus, collapsible components are only formed at the free ends of components 35. These collapsible components are spaced from the surface of the integrated circuit assembly, e.g., layer 25.

FIG. 16 shows a further method for applying conductive material 40 to the components 35. A component material roller 80 rolls material 40 onto the components 35. Such a rolling process is sometimes called wave soldering. Liquid component material 40, e.g., solder, is pumped up through a nozzle and out the end. Gravity then causes the material to fall back down, creating a parabola shaped "wave." The assembly 10 with components 35 travels over the apex of the wave. Assembly 10 travels relative to the roller 80 in the direction of arrow 83. As the wave of solder comes in contact with the bottom side of the assembly 10, the material 40 bonds with the components 35. In an embodiment, the components 35 include fluxed metals that chemically bond with the material 40. In an embodiment, roller 80 times the pulses of material 40 to coincide with the passage of the components 35. In an embodiment, assembly 10 is supported by a conveyor system that moves integrated circuit assemblies such as dies and packages. In an embodiment, the conveyor system moves the assembly 10 into a fluxing area, from the fluxing area through a preheating process, and then over the solder wave formed by solder roller 80. Wave soldering can also be used to form collapsible component 43 on component 35. In an embodiment, the fluxing area is not used.

Figure 17:
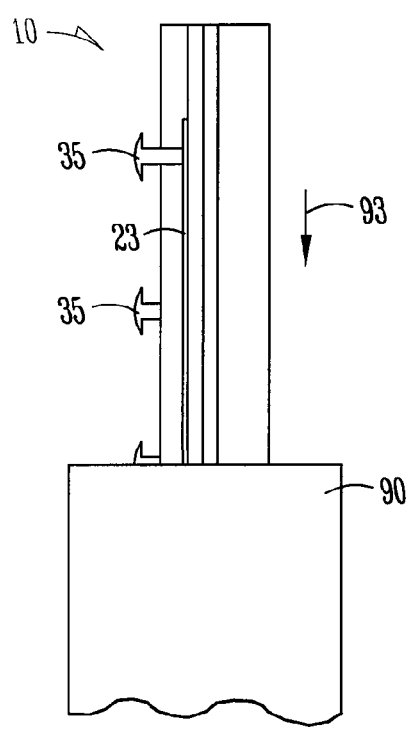
FIG. 17 is an elevational view of the FIG. 11 substrate structure during fabrication according the present invention.
Figure 18:
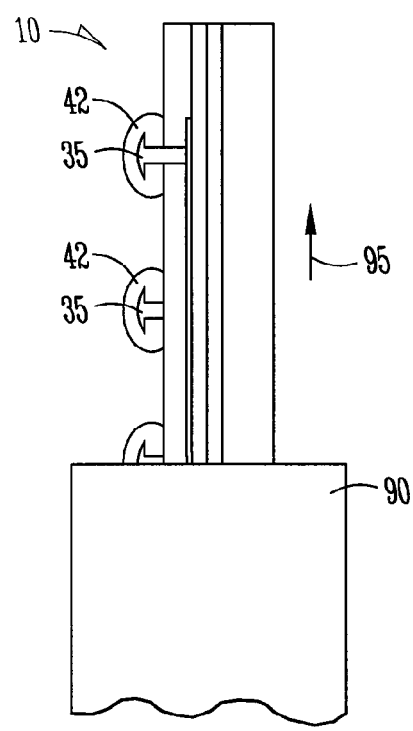
FIG. 18 is an elevational view of the FIG. 11 substrate structure during fabrication according the present invention.

FIGS. 17 and 18 show a further method for applying conductive material to the components 35. The entire assembly 10 including components 35 is dunked into a conductive material source 90. The assembly 10 is moved generally in the direction of arrow 93 into source 90. In an embodiment, component 35 includes a coating. The coating retards oxides from forming on the surface of component 35. In an embodiment, the coating includes a noble metal. In an embodiment, the coating includes gold. In an embodiment, the source includes a covering of nitrogen that eliminates the need for a flux on the component 35. In an embodiment, the assembly 10 includes a flux only on the parts of the assembly where the conductive material should adhere. In an embodiment, only the components 35 include flux. Thus, the conductive material only adheres to the components 35. In an embodiment, the areas on the surface of the assembly 10 closely adjacent the components 35 include flux. The assembly 10 is withdrawn from the source 90 generally as indicated by arrow 95. Conductive material 42 adheres to the components 35.

It is within the scope of the present invention to provide a flux on component 35 to assist in adhering the collapsible component 42 or 43 thereto. That is, a flux is applied to the component 35 prior to or while applying the collapsible component 42 or 43.

Figure 19A:
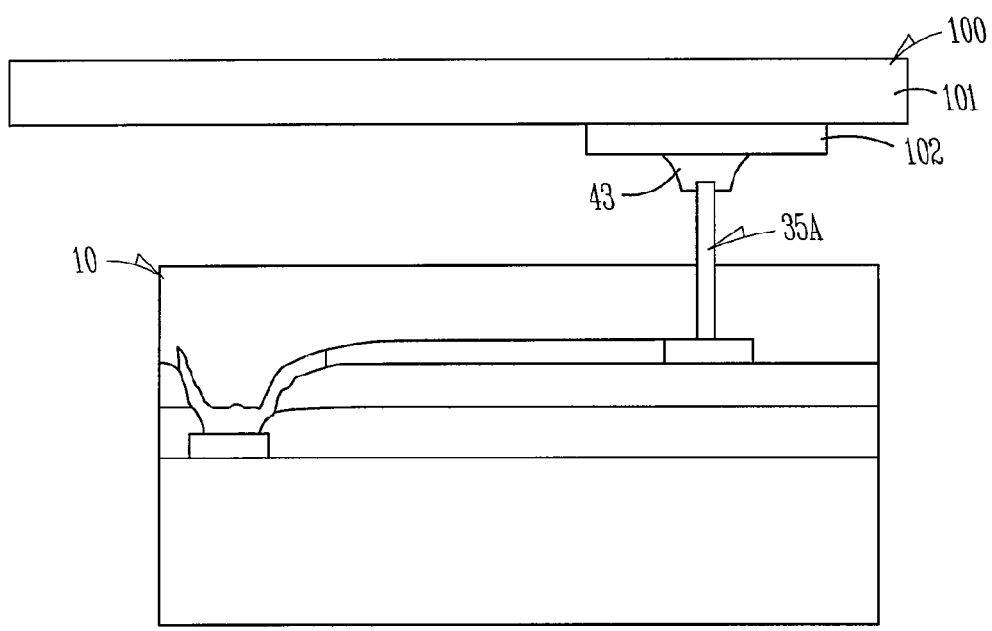
FIG. 19A shows an assembly according to the present invention.

FIG. 19A shows an assembly 100 that includes the integrated circuit device 10 of the present invention and an external circuit 101 that includes a further electrical contact 102. In an embodiment, the external circuit 101 includes a printed circuit board. In an embodiment, external circuit 101 includes a socket in an electrical device. The collapsible component 43 of the connection of the present invention is in its collapsed state. The collapsible component 43 is heated to soften it. Collapsible component 43 is aligned with contact 102. The external circuit 101 and device 10 are pressed together such that the collapsible component 43 and contact 102 press together and form a mechanical bond. In an embodiment, contact 102, collapsible component 43 and component 35 form an electrical contact between circuit 101 and integrated circuit device 10. It will be noted that component 35 of the connection of the present invention does not collapse.

Figure 19B:
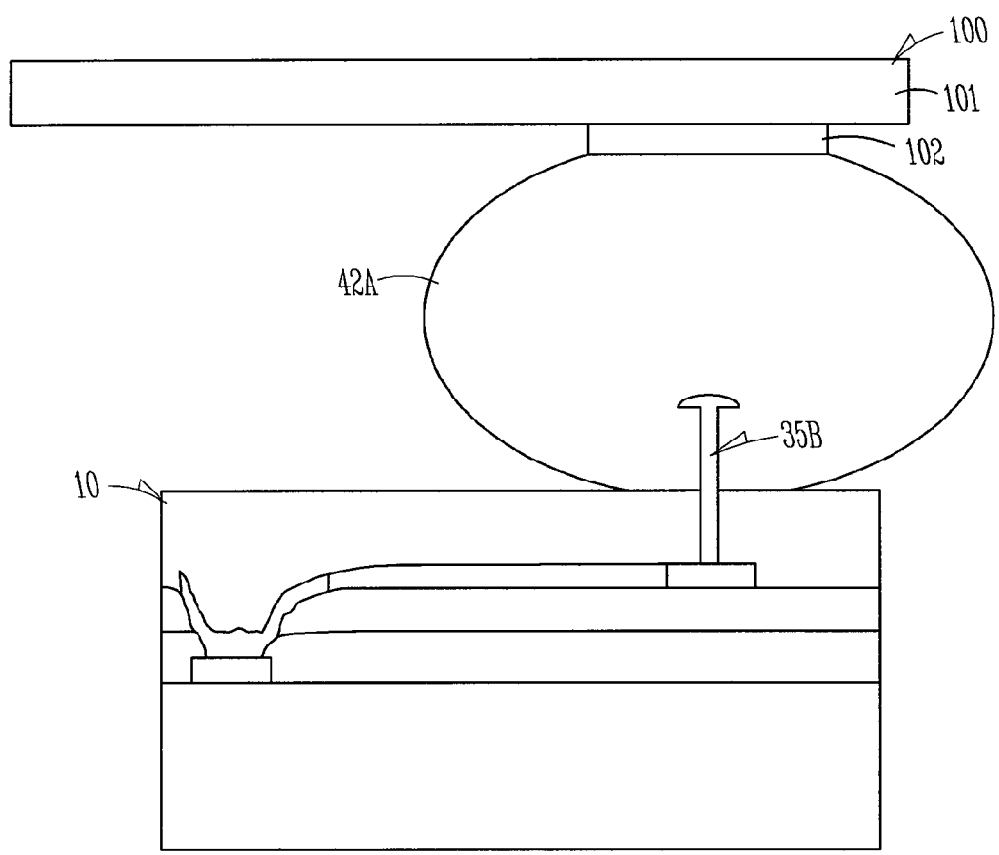
FIG. 19B shows another assembly according to the present invention.

FIG. 19B shows an assembly 100 that includes the integrated circuit device 10 of the present invention and an external circuit 101 that includes a further electrical contact 102. The collapsible component 42 of the connection of the present invention is shown in its collapsed state. The collapsible component 42 is heated to soften it. Collapsible component 42 is aligned with contact 102. The external circuit 101 and device 10 are pressed together such that the collapsible member 42 and contact 102 press together and form a mechanical bond. In an embodiment, contact 102, collapsible component 42 and component 35 form an electrical contact between circuit 101 and integrated circuit device 10. It will be noted that component 35 of the connection of the present invention does not collapse.

FIGS. 19A and 19B show that the embodiments of the present invention are adapted to provide a standoff space between the integrated circuit assembly 10 that includes a connect and the electrical device 100. In an embodiment, this space is filled with an underfill material. Underfill material includes an epoxy resin. In an embodiment, the space is not filled except with air. The space provides additional cooling for at least one of the integrated circuit assembly 10 and the electronic device 100.

Figure 20:
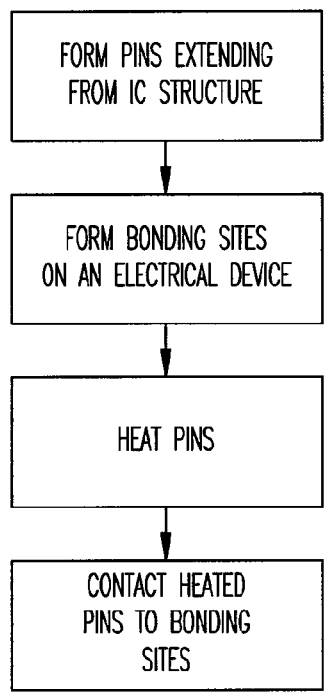
FIG. 20 is a flow chart of a method according to the present invention.

FIG. 20 shows a process according to an embodiment of the present invention. The process includes forming the connections 35 and 42, e.g., first component pins and second component collapsible material, as described herein. The connection(s) extends from the integrated circuit assembly. An electrical device is provided that includes a bonding site for the connection. In an embodiment, bond pads are formed on the electrical device. The connection(s) are heated. In an embodiment, the entire integrated circuit assembly is heated to a temperature that activates the collapsible material. In an embodiment, the die is held in a collet. The collet is heated. The collet heats the die and, hence, the connections, by conduction. The heated pin is brought into contact with the bond site. The heated, collapsible material forms a mechanical joint with the bond site.

In an embodiment, the connection of the present subject matter does not include the collapsible component. The first component 35 of the connection is heated. For example, the first component by conduction from the collet to the die assembly. The heated component 35 is brought into contact with the bond site on the electrical device. The heated component 35 provides the energy to activate an adhesion material on the bond site. In an embodiment, the adhesion material is a collapsible material. In an embodiment, the collapsible material includes a solder.

This process provides a means for creating a mechanical joint to an electrical device that is temperature sensitive. If the electrical device can not be heated to a temperature that will activate the adhesive material, then the adhesive material can not create the mechanical joint. Thus, the integrated circuit assembly of the present invention is heated to provide the needed energy to created the mechanical joint. In an embodiment, the mechanical joint further provides an electrical connection between the integrated circuit assembly 10 and the electrical device 100. The electrical device that has temperature constraints includes an electromagnetic sensing integrated circuit. The electromagnetic sensing integrated circuit, in an embodiment, is adapted to sense the visible light spectrum. The electromagnetic sensing integrated circuit, in an embodiment, is adapted to sense the infrared spectrum. In an embodiment, the electrical device includes a vision system. Conventional vision systems have a temperature limit of about 180 degrees Celsius. If the mechanical joint is created using a solder, then temperature at which solder typically activates, i.e., softens, to form the joint is typically greater than 180 degrees Celsius. Solder conventionally requires temperatures of greater 200 degrees Celsius to activate. In an embodiment, the electrical device includes a microprocessor. Convention microprocessors have a temperature limit of equal to or less than 200 degrees Celsius. In an embodiment, the integrated circuit assembly includes a memory device that is directly connected to the electrical device.

Figure 21:
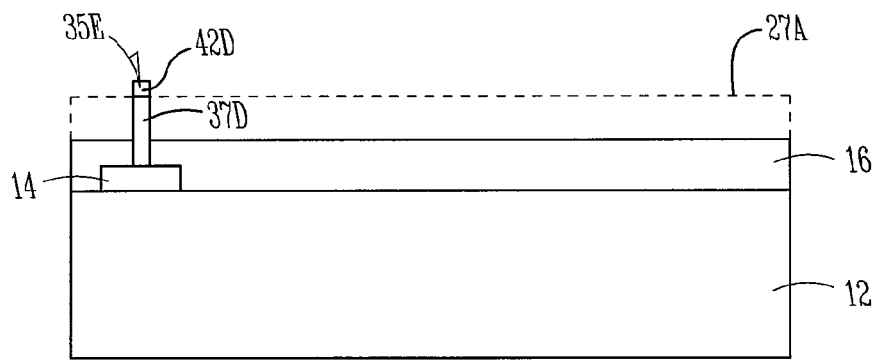
FIG. 21 is a fragmentary cross-sectional view of a substrate structure according to an embodiment of the present invention.

FIG. 21 shows an embodiment of a connection component 35E according to the present invention. Component 35E is similar to the above described components except that it is formed directly on bond pad 14. In an embodiment, passivation or insulating layer 16 is formed as a continuous layer on integrated circuit structure 12 and bond pad 14. In an embodiment, a resist layer 27A shown in broken line in FIG. 21 is deposited on layer 16. Resist layer 27A is patterned and includes an aperture vertically aligned above bond pad 14. Layer 16 is etched through the resist aperture to the bond pad 14, which acts as an etch stop. The component 35E is formed in the resist aperture and etched via in layer 16. Resist layer 27A is stripped. In an embodiment, the component 35E is formed without a collapsible component thereon. As shown in FIG. 21, a collapsible component 42A is formed on the upper end of the body 37D. Further processing and connection formation proceeds as described herein and understood by one of skill in the art. For example, component 35E further includes a collapsible component as described herein.

Integrated circuit devices having a connection assembly 35 and 42 or 35 and 43 of the present invention include memory modules, device drivers, power modules, communication modems, processor modules and application-specific modules, and may include multilayer, multichip modules. Moreover, such devices may be a subcomponent of a variety of electronic systems, such as audio systems, video systems, a clock, a television, a cell phone, computers, an automobile, an industrial control system, an aircraft and others.

It will be understood that the above described embodiments could be formed with the component 35A-35E being the sole part on the integrated circuit connection. That is, the collapsible component is not on component 35A-35E. In this embodiment, the collapsible component, which acts as a joint creating material, is on the electrical device to which the integrated circuit assembly is attached.

It will be further understood that an integrated circuit assembly 10, in an embodiment, includes a plurality of connection components of the present invention. At least a first subset of the plurality of connections are adapted to provide a mechanical connection between the integrated circuit assembly 10 and the electrical device 100. At least one of the plurality of connections provides an electrical connection between the integrated circuit assembly 10 to the electrical device 100. In an embodiment, a second subset of the plurality of connections provide electrical connections between the integrated circuit assembly 10 to the electrical device 100.

The component 35A-35E, in an embodiment, is malleable such that is can be stressed without failing. Failing includes breaking The component 35A-35E as described herein is part of a joint, e.g., connection, between an integrated circuit assembly 10 and an electrical device 100. The assembly 10 and device 100 have different coefficients of thermal expansion, which causes the assembly and device to move relative to one another based on the operating environment. The component 35A-35E is adapted to yield to this relative movement while maintaining the structural and electrical integrity of the connection formed at least in part by the component 35A-35E.

CONCLUSION

The connections of the present invention provide an economically feasible structure and method that produces small device connections that have sufficient strength. The size of device connections continue to shrink as chip sizes shrink and the number of contacts rises. The present invention includes connections that are smaller than 100 microns. However, continued reduction of device connections such as solder balls or bumps increases the likelihood that the device connections will fail. One aspect of the failure is the reduction in material which in turn reduces the area that adheres to the device surface (wetable surface). This reduces shear strength. The present invention provides a connection that improve adhesion of the device connection to the device assembly and improves shear strength. The present invention addresses these problems and provides an improvement in the art by providing a multi-component contact. In an embodiment, a first component of the connection is in the shape of a spike or nail that assists in securing the second, collapsible component (e.g., solder bump) to the surface. In the present invention, the shear value depends on both the connection material and the first component. In an embodiment, the first component is formed of a high shear strength material. For example, the first component is a metal pin. As a result, the device connection has a shear strength that is higher than the collapsible, connection material alone. Moreover, the formation of the first component and application of the connection material to the component does not require a large, expensive investment in equipment. Further, the connection material (solder) will have a limited collapse as the component (spike) acts as an upright to support the connection material during its joining to another structure. Still further, the first component inhibits crack propagation in the connection material in either its formation or during it connection to another structure.

The present invention is directed to an integrated circuit contact and its method of manufacture. An embodiment of the present invention includes a multi-component integrated circuit contact. The contact includes a first component and a second component that provides a mechanical connection to another device. In an embodiment, the second component includes a collapsible component. The collapsible component is adapted to form a mechanical connection with another contact. In an embodiment, the collapsible component forms an electrical connection. In an embodiment, the first component is elongate and has a first portion and a second portion that is adapted to be fixed to an integrated circuit structure. In an embodiment, the first portion includes a neck and a head on the neck. The head has a dimension that is greater than a dimension of the neck. In an embodiment, the dimensions are width. In an embodiment, the collapsible component includes solder. In an embodiment, first component includes a metal. In an embodiment, the first component includes nickel. In an embodiment, the first component includes copper. An embodiment includes a plurality of first components connected to one collapsible component. An embodiment includes a base within the integrated circuit structure connected to the first component.

An embodiment of the present invention includes an integrated circuit that has a bond pad connected to a trace. The first component extends into layers covering the integrated circuit to contact the trace. In an embodiment, a redistribution level covers the integrated circuit. In an embodiment, a passivation layer covers the integrated circuit.

The present invention also includes methods for creating a contact according to the present invention. In an embodiment, the method includes forming a first component that is fixed to an integrated circuit structure and extends above the integrated circuit structure. A second, collapsible component is fixed to the exposed portion of the first component. In an embodiment, the collapsible component is joined to another contact to form a mechanical and/or an electrical connection. An embodiment of the present invention includes providing an integrated circuit structure, forming a redistribution level on the integrated circuit structure, forming a first electrical connection component including a first portion extending from the redistribution level, and forming a second electrical connection component on the first portion. In an embodiment, the integrated circuit structure includes a bond pad. In an embodiment, a passivation layer covers the integrated circuit structure except over at least part of the bond pad. In an embodiment, a trace connects to the bond and the first component.

A further embodiment of the method according to the present invention includes forming a recess in the non-conductive layer of the integrated circuit structure, depositing a conductive material in the recess such that at least a portion of the conductive material extends above the non-conductive layer, and forming a collapsible material on the portion of the conductive material. In an embodiment, forming the recess in the non-conductive layer includes placing a resist layer on the non-conductive layer. In an embodiment, placing the resist layer includes forming an aperture in the resist layer. In an embodiment, forming a recess in the non-conductive layer includes etching through the aperture to form a via in the non-conductive layer to a conductor that is connected to an integrated circuit. In an embodiment, depositing a conductive material in the recess includes placing a conductive material in the aperture and the via. In an embodiment, placing the conductive material includes plating a metal in the aperture and the via. In an embodiment, depositing a conductive material includes removing the resist layer such that the portion of the conductive material extends above the integrated circuit structure. In an embodiment, forming a collapsible material on the portion of the conductive material includes placing a solder on the portion of the conductive material. In an embodiment, forming a collapsible material on the portion of the conductive material includes dipping the portion of the conductive material in a collapsible material bath. In an embodiment, forming a collapsible material on the portion of the conductive material includes rolling the portion of the conductive material in a collapsible material bath. In an embodiment, forming a collapsible material on the portion of the conductive material includes using a solder wave to place the collapsible material on the portion of the conductive material. In an embodiment, forming a collapsible material on the portion of the conductive material includes dunking the entire portion of the conductive material and the integrated circuit structure in a bath of collapsible material.

The present invention also includes substrates, wafers, integrated circuit packages, electrical devices, memory units, memory modules, electrical systems, computers, which include a contact according to the present invention.

These and other embodiments, aspects, advantages, and features of the present invention will be set forth in part in the description, and in part will become apparent to those skilled in the art by reference to the description and referenced drawings or by practice of the invention. The aspects, advantages, and features of the invention are realized and attained by means of the instrumentalities, procedures, and combinations particularly pointed out in the appended claims.

Although specific embodiments have been illustrated and described herein, it will be appreciated by those of ordinary skill in the art that any arrangement which is calculated to achieve the same purpose may be substituted for the specific embodiments shown. Adaptations of the invention will be apparent to those of ordinary skill in the art. Accordingly, this application is intended to cover any adaptations or variations of the invention. It is manifestly intended that this invention be limited only by the following claims and equivalents thereof.

The invention claimed is:

1. An integrated circuit connection assembly comprising:
   an elongate first conductor including a first portion and a second portion, the second portion configured to be attached to an integrated circuit structure; and
   a second conductor, wherein the first portion of the first conductor extends into the second conductor in a first direction,
   wherein the first conductor includes a first end having a head, the head having a head dimension extending within the second conductor in a second direction substantially perpendicular to the first direction,
   wherein the second portion of the first conductor includes a stud, the stud having a stud body extending in the first direction and a stud cap extending substantially perpendicular to the first direction, wherein the stud body extends through an insulating layer and includes an upper surface co-planar with an upper surface of the insulating layer, wherein the stud cap is between the first portion and the stud body of the first conductor and is attached to the first portion and the stud body of the first conductor, and wherein a width of the stud cap is greater than a width of the stud body.

2. The integrated circuit connection assembly of claim 1, wherein the second portion includes a second end, and wherein the second end is attached to a base, the base extending within the integrated circuit structure in a third direction substantially perpendicular to the first direction.

3. The integrated circuit connection assembly of claim 2, wherein the elongate first conductor and the base are formed of a same material.

4. The integrated circuit connection assembly of claim 1, wherein the second conductor includes solder and the first conductor includes a material having a higher shear strength than the second conductor.

5. The integrated circuit connection assembly of claim 1, wherein the second conductor includes a solder ball.

6. An integrated circuit connection assembly comprising:
   a base in an integrated circuit structure;
   an elongate first conductor including a first portion and a second portion, the second portion being attached to the base;
   a second conductor, wherein the first portion of the first conductor extends into the second conductor in a first direction,
   wherein the first conductor includes a first end having a head, the head having a head dimension extending within the second conductor in a second direction substantially perpendicular to the first direction,
   wherein the second portion includes a stud, the stud having a stud body extending in the first direction and a stud cap extending substantially perpendicular to the first direction, wherein the stud body extends through an insulating layer and includes an upper surface co-planar with an upper surface of the insulating layer, and wherein the stud cap is between the first portion and the stud body of the first conductor and is attached to the first portion and the stud body of the first conductor, and wherein a width of the stud cap is greater than a width of the stud body.

7. The integrated circuit connection assembly of claim 6, wherein the first conductor includes a longitudinal first axis, the first portion of the first conductor including a first surface extending substantially radially outwardly from the first axis to an outer edge of the first surface, the first portion including a rounded second surface remote from the second portion and extending from the outer edge of the first surface to approximately a center of the second surface along the first axis.

8. The integrated circuit connection assembly of claim 7, wherein the first axis extends in the first direction.

9. The integrated circuit connection assembly of claim 6, wherein the second conductor includes a collapsible material.

10. The integrated circuit connection assembly of claim 6, wherein the first conductor includes a rigid body.

11. An integrated circuit connection assembly comprising:
   an elongate first conductor including a first portion and a second portion, the second portion configured to be attached to an integrated circuit structure, the first conductor including a longitudinal first axis, the first conductor including a first end, the first end including a head having a head dimension extending radially outward from the first axis; and
   a second conductor, wherein the first portion of the first conductor extends into the second conductor along the first axis,
   wherein the second portion includes a stud, the stud having a stud body extending in the first direction and a stud cap extending substantially perpendicular to the first direction, wherein the stud body extends through an insulating layer and includes an upper surface co-planar with an upper surface of the insulating layer, and
   wherein the stud cap is between the first portion and the stud body of the first conductor and is attached to the first portion and the stud body of the first conductor, and wherein a width of the stud cap is greater than a width of the stud body.

12. The integrated circuit connection assembly of claim 11, wherein the head of the first conductor includes:
   a first surface extending substantially radially outward from the first axis to an outer edge of the first surface; and
   a rounded second surface extending from the outer edge of the first surface to a center of the second surface along the first axis.

13. The integrated circuit connection assembly of claim 11, comprising a base extending within the integrated circuit structure in a direction substantially perpendicular to the first axis, wherein the second portion of the first conductor includes a third end, wherein the third end is attached to the base.

14. An integrated circuit connection assembly comprising:
   an elongate first conductor including a first portion and a second portion, the second portion configured to be attached to an integrated circuit structure; and
   a second conductor, wherein the first portion of the first conductor extends into the second conductor in a vertical direction, wherein the second portion of the first conductor includes a stud having a stud body extending in the vertical direction and a stud cap extending in a horizontal direction, and wherein the stud body extends through an insulating layer and includes an upper surface co-planar with an upper surface of the insulating layer, wherein the stud cap is between the first portion and the stud body of the first conductor and is attached to the first portion and the stud body of the first conductor, and wherein a width of the stud cap is greater than a width of the stud body.

* * * * *